(12) United States Patent
Bierbaumer et al.

(10) Patent No.: US 11,309,889 B2
(45) Date of Patent: Apr. 19, 2022

(54) CAPACITIVE PROXIMITY SWITCH

(71) Applicant: Bayerische Motoren Werke Aktiengesellschaft, Munich (DE)

(72) Inventors: Andreas Bierbaumer, Prutting (DE); Tobias Mueller-Kambeitz, Landau (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 140 days.

(21) Appl. No.: 16/775,444

(22) Filed: Jan. 29, 2020

(65) Prior Publication Data
US 2020/0195249 A1 Jun. 18, 2020

Related U.S. Application Data

(63) Continuation of application No. PCT/EP2018/069233, filed on Jul. 16, 2018.

(30) Foreign Application Priority Data

Aug. 4, 2017 (DE) ...................... 10 2017 213 548.4

(51) Int. Cl.
*G01R 27/26* (2006.01)
*H03K 17/955* (2006.01)
*H03K 17/96* (2006.01)

(52) U.S. Cl.
CPC ......... *H03K 17/955* (2013.01); *H03K 17/962* (2013.01); *H03K 2217/960755* (2013.01)

(58) Field of Classification Search
USPC ................................................ 324/658–689
See application file for complete search history.

(56) References Cited

U.S. PATENT DOCUMENTS

2003/0071738 A1 4/2003 Joly et al.
2018/0043794 A1* 2/2018 Lilley ..................... A47C 7/72

FOREIGN PATENT DOCUMENTS

DE 20 2004 008 952 U1 10/2004
DE 10 2011 115 803 A1 4/2013
(Continued)

OTHER PUBLICATIONS

International Search Report (PCT/ISA/210) issued in PCT Application No. PCT/EP2018/069233 dated Sep. 28, 2018 with English translation (four (4) pages).
(Continued)

*Primary Examiner* — Vincent Q Nguyen
(74) *Attorney, Agent, or Firm* — Crowell & Moring LLP

(57) ABSTRACT

A capacitive proximity switch has a fiber composite body, which has an electrically non-conductive matrix and a multiplicity of fibers embedded in the matrix. The capacitive proximity switch includes at least one first capacitive proximity sensor, at least one second capacitive proximity sensor and one or more sensor evaluation devices. The first capacitive proximity sensor has at least one sensor electrode, which has at least one electrically conductive fiber, which is embedded in the matrix. The second capacitive proximity sensor has at least one further sensor electrode, which has at least one electrically conductive fiber, which is embedded in the matrix. The sensor electrode of the first capacitive proximity sensor and the further sensor electrode of the second capacitive proximity sensor are each connected to a sensor evaluation apparatus.

13 Claims, 1 Drawing Sheet

(56) References Cited

FOREIGN PATENT DOCUMENTS

DE   10 2012 011 922 A1   12/2013
EP          2 733 590 A2    5/2014
WO   WO 2017/095861 A1    6/2017

OTHER PUBLICATIONS

German-language Written Opinion (PCT/ISA/237) issued in PCT Application No. PCT/EP2018/069233 dated Sep. 28, 2018 (six (6) pages).
German-language Search Report issued in counterpart German Application No. 10 2017 213 548.4 dated Apr. 26, 2018 with partial English translation (14 pages).
Dahiya R. et al., "Robotic Tactile Sensing Technologies and System", 2013, pp. 79-136, Springer (88 pages).
Schuermann H., "Konstruieren mit Faser-Kunststoff-Verbunden", 2007, pp. 229-246, Springer (148 pages).

\* cited by examiner

CAPACITIVE PROXIMITY SWITCH

CROSS REFERENCE TO RELATED APPLICATIONS

This application is a continuation of PCT International Application No. PCT/EP2018/069233, filed Jul. 16, 2018, which claims priority under 35 U.S.C. § 119 from German Patent Application No. 10 2017 213 548.4, filed Aug. 4, 2017, the entire disclosures of which are herein expressly incorporated by reference.

BACKGROUND AND SUMMARY OF THE INVENTION

The invention relates to a capacitive proximity switch. Furthermore, the invention relates to an interior and/or exterior component for a motor vehicle which includes at least one capacitive proximity switch.

Producing vehicle components from fiber composite material, which can comprise carbon fibers, for example, which are embedded in a plastic matrix, is known in the prior art. The carbon fibers act as reinforcing fibers of the component, and the reinforcements can be laid out along the force flow lines. Components made of carbon-fiber-reinforced plastic are distinguished by having a low mass and high rigidity at the same time.

In addition to these properties, vehicle components made of fiber composite material conventionally do not have further functions.

Various solutions are known from the prior art for the contactless proximity detection of an object at a capacitive proximity sensor, which differ in the manner of the signal generation and the measurement.

A first principle known from the prior art for capacitive proximity detection provides the use of a capacitive proximity sensor having a single electrode. In this measurement principle, the capacitance of the electrode is detected in relation to the ground potential of the measurement electronics of the capacitive proximity sensor and analyzed. This measurement principle is also referred to as a "loading method". If an object, such as a user, approaches the sensor electrode, the capacitance at the sensor electrode then changes, which can accordingly be detected and analyzed.

A further measurement principle known from the prior art provides a capacitive proximity sensor having two sensor electrodes. One sensor electrode is operated in this case as an emitting electrode and the other sensor electrode as a receiving electrode. The electrical alternating field emitted at the emitting electrode is coupled into the receiving electrode and measured via an electrical signal tapped at the receiving electrode. This method is also referred to as a "transmission method", since it measures the transmission between an emitter and a receiver. If a user approaches the sensor electrodes, the electrical alternating field formed between the emitting electrode and the receiving electrode changes, which can be measured and analyzed accordingly.

Capacitive proximity switches are often produced as printed conductor tracks on films and then applied to components. The printed conductor tracks are normally visible. If they are not supposed to be visible, the film has to be applied behind the component, wherein the material of the component cannot influence the switch, however.

One object to be achieved of at least some embodiments is to provide a capacitive proximity switch in which the printing of conductor tracks can be omitted. A further object is to provide an interior and/or exterior component for a motor vehicle having such a capacitive proximity switch.

A capacitive proximity switch described here comprises, according to at least one embodiment, a fiber composite body which comprises an electrically nonconductive matrix and a plurality of fibers embedded in the matrix. The matrix can be, for example, a plastic matrix, which can comprise, for example, a thermoplastic or a thermosetting plastic or can consist thereof, respectively. Alternatively, the matrix can comprise a ceramic material or can consist thereof.

The terms "proximity switch" and "proximity sensor" here and hereafter are to include both contactlessly functioning sensors, in particular contactless capacitive sensors, and also contacting sensors, i.e., sensors which react to contact, for example, tactile capacitive sensors.

Furthermore, the capacitive proximity switch comprises at least one first capacitive proximity sensor, which comprises at least one sensor electrode, and at least one second capacitive proximity sensor, which comprises at least one further sensor electrode. The sensor electrode of the first capacitive proximity sensor and the further sensor electrode of the second capacitive proximity sensor each comprise at least one electrically conductive fiber, which are each embedded in the matrix. Furthermore, the sensor electrode and the further sensor electrode can each consist of an electrically conductive fiber.

The sensor electrode and the further sensor electrode are preferably each electrically conductively connected to a sensor analysis device. The sensor analysis device can be, for example, an analysis circuit. Alternatively, the sensor electrode can be connected to a first analysis circuit and the further sensor electrode can be connected to a second analysis circuit. The first capacitive proximity sensor and the second capacitive proximity sensor can each comprise, for example, a separate circuit. The individual capacitive proximity sensors are preferably configured in such a way that they can function independently of one another as proximity switches.

Because of the plurality of the capacitive proximity sensors, which can each comprise an electrically conductive fiber as a sensor electrode, a contactless touchpad can be implemented within the fiber composite body, by means of which, for example, a two-dimensional or three-dimensional user interface can be enabled as in the case of a sensor matrix. In particular, not only can a proximity of an object be detected, but rather an accurate position detection can be performed, so that, for example, a volume control or a light intensity control can be performed by means of the capacitive proximity switch.

According to a further embodiment, the sensor electrode and/or the further sensor electrode comprise one or more of the carbon fibers or consist of one or more carbon fibers.

According to a further embodiment, the sensor electrode and/or the further sensor electrode comprise one or more metallic fibers or consist of one or more metallic fibers.

According to a further embodiment, the capacitive proximity switch comprises a plurality of nonconductive fibers, which are arranged and/or embedded in the fiber composite body. The nonconductive fibers can be, for example, glass fibers. A separation of the electrically conductive fibers in the textile production process can be facilitated, for example, by means of the nonconductive fibers.

According to a further embodiment, the first capacitive proximity sensor and the second capacitive proximity sensor function on the principle of the loading method. The capacitive proximity sensors then do not comprise additional sensor electrodes, for example, in addition to the sensor electrode and/or further sensor electrode. Alternatively, the first capacitive proximity sensor the second capacitive proximity sensor can also function on the principle of the transmission method and can comprise additional sensor electrodes, which can also be implemented, for example, as electrically conductive fibers embedded in the matrix. For example, the capacitive proximity sensors can each comprise one or more reference electrodes, coupling electrodes, or shielding electrodes, which can be formed, for example, as fibers embedded in the matrix.

According to a further embodiment, the electrically conductive fibers of the sensor electrode and electrically conductive fibers of the further sensor electrode extend substantially in the same main propagation direction. For example, the electrically conductive fibers can extend substantially in parallel within the matrix.

According to a further embodiment, the electrically conductive fibers of the sensor electrode and electrically conductive fibers of the further sensor electrode extend in different main propagation directions. The electrically conductive fibers can extend, for example, substantially perpendicularly to one another.

According to a further embodiment, the electrically conductive fibers of the sensor electrode and electrically conductive fibers of the further sensor electrode have an essentially equal distance to a surface of the fiber composite body. For example, the electrically conductive fibers can have the same distance to a visible surface of the fiber composite body and/or to a visible surface of a component containing the fiber composite body.

According to a further embodiment, electrically conductive fibers of the sensor electrode and electrically conductive fibers of the further sensor electrode extend in different planes within the fiber composite body. The electrically conductive fibers can have, for example, different distances to a visible surface of the fiber composite body.

According to a further embodiment, the electrically conductive fibers of the sensor electrode and/or the electrically conductive fibers of the further sensor electrode are formed as unidirectional fibers and/or as endless fibers. Furthermore, the electrically conductive fibers of the sensor electrode and/or the electrically conductive fibers of the further sensor electrode can each be part of a fiber bundle.

According to a further embodiment, the fiber composite body furthermore comprises a plurality of electrically nonconductive fibers. The electrically nonconductive fibers can be, for example, glass fibers.

According to a further embodiment, the fibers of the fiber composite body are embodied as a fiber scrim, fiber woven fabric, fiber mesh, and/or as a fiber embroidery. The electrically conductive fibers of the sensor electrode and/or the electrically conductive fibers of the further sensor electrode can each be part of the fiber scrim and/or fiber woven fabric and/or fiber mesh or the fiber embroidery.

According to a further embodiment, the capacitive proximity switch comprises one or more further capacitive proximity sensors, which each comprise at least one sensor electrode, which respectively comprises at least one electrically conductive fiber which is embedded in the matrix.

Furthermore, an interior and/or exterior component for a motor vehicle is specified. The interior and/or exterior component comprises at least one capacitive proximity switch according to one of the above-mentioned embodiments.

Other objects, advantages and novel features of the present invention will become apparent from the following detailed description of one or more preferred embodiments when considered in conjunction with the accompanying drawings.

DETAILED DESCRIPTION OF THE DRAWINGS

In the exemplary embodiments and the figures, identical or identically-acting components can each be provided with identical reference signs. The illustrated elements and the size relationships thereof are fundamentally not to be considered to be to scale. Rather, individual elements can be shown dimensioned exaggeratedly thick or large for better representability and/or for better comprehension.

Figure 1:
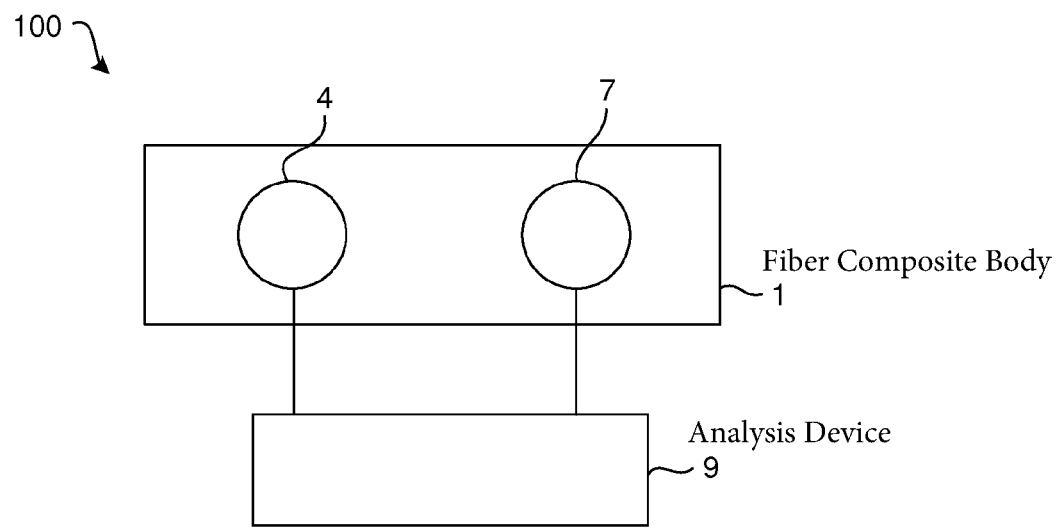
FIG. 1 shows a schematic illustration of a capacitive proximity switch according to one exemplary embodiment.
Figure 2:
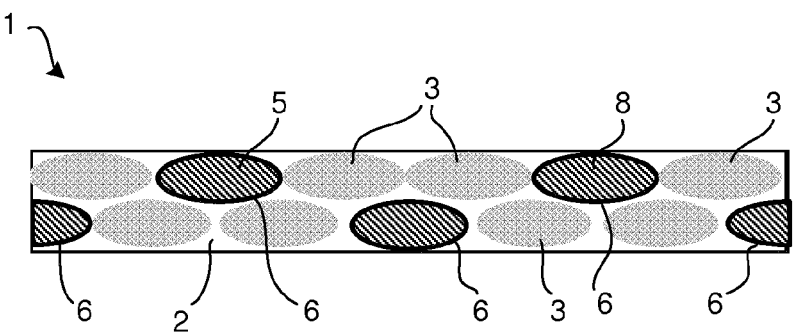
FIG. 2 shows a schematic illustration of a fiber composite body of the capacitive proximity switch according to a first exemplary embodiment.
Figure 3:
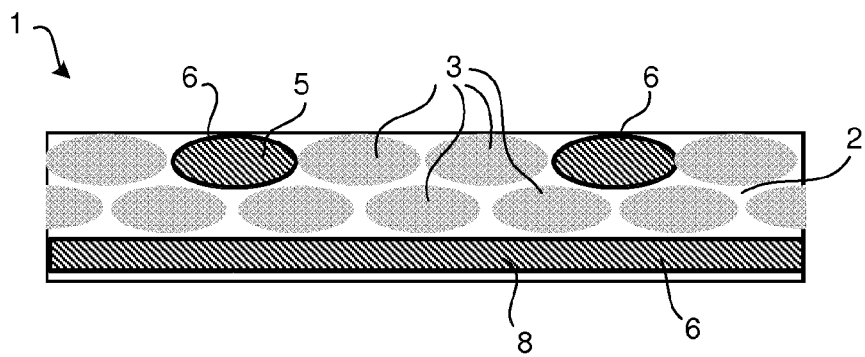
FIG. 3 shows a schematic illustration of a fiber composite body of the capacitive proximity switch according to a further exemplary embodiment.

FIG. 1 shows a schematic illustration of a capacitive proximity switch 100 according to one exemplary embodiment. FIGS. 2 and 3 show schematic illustrations of two possible exemplary embodiments of a fiber composite body 1 of the capacitive proximity switch 100 from FIG. 1.

The capacitive proximity switch 100 comprises a fiber composite body 1, which comprises an electrically nonconductive matrix 2 and a plurality of fibers 3, 6 embedded in the matrix. The fibers 3, 6 are formed in the exemplary embodiment shown as unidirectional endless fibers. A part of the fibers 3, 6 are nonconductive fibers 3, which can be glass fibers, for example. Another part of the fibers 3, 6 are conductive fibers 6, which can be carbon fibers or metal fibers, for example.

Furthermore, the capacitive proximity switch 100 comprises a first capacitive proximity sensor 4 and a second capacitive proximity sensor 7, which are each embedded in the fiber composite body 1. The capacitive proximity sensors 4, 7 are each connected to a sensor analysis device 9. Alternatively, the capacitive proximity sensors 4, 7 can be connected to different sensor analysis devices.

The first capacitive proximity sensor 4 comprises a sensor electrode 5, which is formed from one of the electrically conductive fibers 6 which are embedded in the matrix 2. The second capacitive proximity sensor 7 comprises a further sensor electrode 8, which is also formed from one of the electrically conductive fibers 6 embedded in the matrix 2. The sensor electrodes 5, 8 are preferably each electrically conductively connected to the analysis device 9.

In the exemplary embodiment according to FIG. 2, the sensor electrode 5 and the further sensor electrode 8 are arranged in the fiber composite body 1 in such a way that they extend essentially in parallel to one another and have an essentially equal distance to the closest surface of the fiber composite body 1.

A further exemplary embodiment is illustrated in FIG. 3, in which the electrically conductive fibers 6 of the sensor electrode 5 and the electrically conductive fibers 6 of the further sensor electrode 8 extend in different main propagation directions. In particular, the further sensor electrode 8 extends in a direction perpendicular to the sensor electrode 5.

Furthermore, the capacitive proximity switch 100 can comprise one or more further capacitive proximity sensors, which each comprise a sensor electrode formed as electrically conductive fibers, which are embedded in the matrix 2 of the fiber composite body 1. The capacitive proximity switch 100 can comprise, for example, a touchpad functionality, by way of which, as with a sensor matrix, the operation of a device, for example, an operating device of a motor vehicle, can be performed. For example, a user can execute a stroking movement or pointing movement in proximity to or directly on the fiber composite body, whereby then signals can be transmitted to a control unit by means of the sensor analysis device. The control unit can be connected to an output unit, which as a consequence generates optical, acoustic, and/or haptic outputs.

The features described in the exemplary embodiments shown can also be combined with one another according to further exemplary embodiments. Alternatively or additionally, the exemplary embodiments shown in the figures can comprise further features according to the embodiments of the general description.

LIST OF REFERENCE SIGNS

1 fiber composite body
2 matrix
3 electrically nonconductive fiber
4 first capacitive proximity sensor
5 sensor electrode
6 electrically conductive fiber
7 second capacitive proximity sensor
8 further sensor electrode
9 sensor analysis device
100 capacitive proximity switch The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A capacitive proximity switch, comprising:
   a fiber composite body, which comprises an electrically nonconductive matrix and a plurality of fibers embedded in the matrix;
   at least one first capacitive proximity sensor, which comprises at least one sensor electrode, wherein the sensor electrode consists of at least one electrically conductive fiber which is embedded in the matrix;
   at least one second capacitive proximity sensor, which comprises at least one further sensor electrode, wherein the further sensor electrode consists of at least one electrically conductive fiber which is embedded in the matrix; and
   one or more sensor analysis devices, to which the sensor electrode of the first capacitive proximity sensor and the further sensor electrode of the second capacitive proximity sensor are connected,
   wherein one or both of the sensor electrode and the further sensor electrode consist of one or more carbon fibers.

2. The capacitive proximity switch according to claim 1, wherein
   one of the sensor electrode and the further sensor electrode consists of one or more metallic fibers, and the other of the sensor electrode and the further sensor electrode consists of one or more carbon fibers.

3. The capacitive proximity switch according to claim 1, wherein
   the at least one electrically conductive fiber of the sensor electrode and the at least one electrically conductive fiber of the further sensor electrode extend substantially in a same main propagation direction.

4. The capacitive proximity switch according to claim 1, wherein
   the at least one electrically conductive fiber of the sensor electrode and the at least one electrically conductive fiber of the further sensor electrode extend in different main propagation directions.

5. The capacitive proximity switch according to claim 1, wherein
   the at least one electrically conductive fiber of the sensor electrode and the at least one electrically conductive fiber of the further sensor electrode have a substantially equal distance to a surface of the fiber composite body.

6. The capacitive proximity switch according to claim 1, wherein
   the at least one electrically conductive fiber of the sensor electrode and the at least one electrically conductive fiber of the further sensor electrode extend in different planes within the fiber composite body.

7. The capacitive proximity switch according to claim 1, wherein
   one or both of the at least one electrically conductive fiber of the sensor electrode and the at least one electrically conductive fiber of the further sensor electrode are formed as unidirectional fibers and/or as endless fibers.

8. The capacitive proximity switch according to claim 1, wherein the fiber composite body comprises a plurality of electrically nonconductive fibers.

9. The capacitive proximity switch according to claim 1, wherein
   one or both of the at least one electrically conductive fiber of the sensor electrode and or the at least one electrically conductive fiber of the further sensor electrode are each part of a fiber bundle.

10. The capacitive proximity switch according to claim 1, wherein
    fibers of the fiber composite body are embodied as a fiber scrim, fiber woven fabric, fiber mesh, and/or fiber embroidery.

11. The capacitive proximity switch according to claim 10, wherein
    the at least one electrically conductive fiber of the sensor electrode and the at least one electrically conductive fiber of the further sensor electrode are each part of the fiber scrim, fiber woven fabric, fiber mesh, and/or fiber embroidery.

12. The capacitive proximity switch according to claim 1, further comprising:
    one or more further capacitive proximity sensors, which each comprise at least one sensor electrode, which respectively comprises at least one electrically conductive fiber, which are embedded in the matrix.

13. An interior and/or exterior component for a motor vehicle, comprising:
    at least one capacitive proximity switch according to claim 1.

* * * * *